(12) United States Patent
Holscher, Jr.

(10) Patent No.: US 7,799,491 B2
(45) Date of Patent: Sep. 21, 2010

(54) COLOR FILTER ARRAY AND IMAGING DEVICE CONTAINING SUCH COLOR FILTER ARRAY AND METHOD OF FABRICATION

(75) Inventor: Richard D. Holscher, Jr., Boise, ID (US)

(73) Assignee: Aptina Imaging Corp., Grand Cayman (KY)

( * ) Notice: Subject to any disclaimer, the term of this patent is extended or adjusted under 35 U.S.C. 154(b) by 1200 days.

(21) Appl. No.: 11/399,312

(22) Filed: Apr. 7, 2006

(65) Prior Publication Data

US 2007/0238034 A1 Oct. 11, 2007

(51) Int. Cl.
*G02B 5/20* (2006.01)
*H01L 31/0232* (2006.01)
(52) U.S. Cl. .......................................... 430/7; 257/440
(58) Field of Classification Search ................ None
See application file for complete search history.

(56) References Cited

U.S. PATENT DOCUMENTS

| 5,321,249 | A | * | 6/1994 | Nomura ............ 250/208.1 |
|---|---|---|---|---|
| 5,708,264 | A | | 1/1998 | Hawkins et al. |
| 6,140,630 | A | | 10/2000 | Rhodes |
| 6,204,524 | B1 | | 3/2001 | Rhodes |
| 6,297,071 | B1 | | 10/2001 | Wake |
| 6,310,366 | B1 | | 10/2001 | Rhodes et al. |
| 6,326,652 | B1 | | 12/2001 | Rhodes |
| 6,333,205 | B1 | | 12/2001 | Rhodes |
| 6,376,868 | B1 | | 4/2002 | Rhodes |
| 6,379,992 | B2 | | 4/2002 | Jo et al. |
| 6,445,453 | B1 | | 9/2002 | Hill |
| 6,473,238 | B1 | | 10/2002 | Daniell |
| 6,552,805 | B2 | | 4/2003 | Hill |
| 6,587,276 | B2 | | 7/2003 | Daniell |
| 6,606,159 | B1 | | 8/2003 | Hill |
| 6,617,189 | B1 | | 9/2003 | Chen et al. |
| 6,667,809 | B2 | | 12/2003 | Hill |
| 6,721,101 | B2 | | 4/2004 | Daniell |
| 6,753,968 | B2 | | 6/2004 | Hill |

(Continued)

FOREIGN PATENT DOCUMENTS

EP 0 959 505 A2 11/1999

(Continued)

OTHER PUBLICATIONS

"Fabrication and Performance of Color Filter Arrays for Solid-State Imagers" Dillon, P.L.P.; Brault, A.T.; Horak, J.R.; Garcia, E.; Martin, T.W.; Light, W.A.; Solid-State Circuits, IEEE Journal of vol. SC-13, Issue 1, Feb. 1978, pp. 23-27.

(Continued)

*Primary Examiner*—John A. McPherson
(74) *Attorney, Agent, or Firm*—Dickstein Shapiro LLP

(57) ABSTRACT

A method and apparatus are disclosed which provide a color filter array for an imaging device in which the filters of the array are accurately positioned through the use of a patterned mask layer used to form filters for one color of the array. Additionally or alternatively, the color filter array can have a light blocking spacer to block light from being transmitted between color filters and/or to a peripheral circuitry region.

44 Claims, 9 Drawing Sheets

U.S. PATENT DOCUMENTS

| | | | |
|---|---|---|---|
| 6,775,009 | B2 | 8/2004 | Hill |
| 6,847,029 | B2 | 1/2005 | Hill |
| 7,002,231 | B2 | 2/2006 | Rhodes et al. |
| 2002/0033492 | A1 | 3/2002 | Lee et al. |
| 2004/0131955 | A1* | 7/2004 | Yen .............................. 430/7 |
| 2004/0234873 | A1 | 11/2004 | Venkataraman |
| 2004/0246351 | A1 | 12/2004 | Hiatt et al. |
| 2005/0170563 | A1 | 8/2005 | Ang et al. |
| 2006/0131275 | A1 | 6/2006 | Bian |
| 2006/0138500 | A1* | 6/2006 | Kim ........................... 257/294 |
| 2006/0143993 | A1 | 7/2006 | Kim et al. |
| 2006/0146233 | A1 | 7/2006 | Park |
| 2006/0240221 | A1 | 10/2006 | Ramarajan |
| 2006/0255372 | A1 | 11/2006 | Patrick et al. |

FOREIGN PATENT DOCUMENTS

WO    WO 2005/122262 A1    12/2005

OTHER PUBLICATIONS

"Slurry Engineering for Self-Stopping, Dishing Free $SIO_2$-CMP" H. Nojo, M. Kodera and R. Nakata; Semicond. Manuf. Engl. Center, Toshiba Corp., Kawasaki Electron Devices Meeting, 1996, International Publ. Date Dec. 8-11, 1996; pp. 349-352; Meeting date: Dec. 8, 1996-Dec. 11, 1996.

CMOS Image Sensors (Article is a priced publication, not included in Zip File) El Gamal, A. Eltoukhy, H.; Stanford Univ., CA, USA; Circuits and Devices Magazine, IEEE Publication Date: May-Jun. 2005; vol. 21, Issue 3; pp. 6-20.

"MEMS Meets Nano-optics", by Hubert Kostal and Jim Wong, Nov. 2005, Fiber Optic Technology, pp. 8-13.

* cited by examiner

COLOR FILTER ARRAY AND IMAGING DEVICE CONTAINING SUCH COLOR FILTER ARRAY AND METHOD OF FABRICATION

FIELD OF THE INVENTION

The present invention relates generally to semiconductor devices, and in particular to imaging devices and methods of forming the same.

BACKGROUND OF THE INVENTION

Solid state image sensors, also known as imagers, have commonly been used in photo-imaging applications. An imager absorbs incident radiation of a particular wavelength (such as optical photons, x-rays, or the like) and generates an electrical signal corresponding to the absorbed radiation. There are a number of different types of semiconductor-based imagers, including charge coupled devices (CCDs), photodiode arrays, charge injection devices (CIDs), hybrid focal plan arrays, and complementary metal oxide semiconductor (CMOS) imagers. These imagers, when used with appropriate imaging circuits, capture, process and display images for various purposes. Current applications of solid state imagers include cameras, scanners, machine vision systems, vehicle navigation systems, video telephones, computer input devices, surveillance systems, auto focus systems, star trackers, motion detector systems, and image stabilization systems among other uses.

For capture of visible or infrared images these imagers typically consist of an array of pixel cells containing photosensors, where each pixel cell produces a signal corresponding to the intensity of light impinging on that element when an image is focused on the array. These signals may then be stored, for example, to display a corresponding image on a monitor or otherwise used to provide information about the optical image. The photosensors are typically phototransistors, photoconductors or photodiodes. The magnitude of the signal produced by each pixel, therefore, is proportional to the amount of light impinging on the photosensor.

To allow the photosensors to capture a color image within the visual image, the photosensors are often formed to separately detect red (R) photons, green (G) photons and blue (B) photons. Accordingly, each pixel is formed to be sensitive only to one color or spectral band. For this, a color filter array (CFA) is typically placed in front of the array of pixels so that each pixel measures the light of the color of its associated filter. Thus, each pixel of a color image sensor is covered with either a red, green or blue filter, according to a specific pattern.

Color filter arrays are commonly arranged in a mosaic sequential pattern of red, green, and blue filters, such as a Bayer filter pattern, which is quartet-ordered with successive rows that alternate red and green filters, then green and blue filters. To form the color filters, a resist is typically used containing a color pigment. For example, the Bayer filter pattern requires the printing and patterning of three resist layers on a passivation layer, each of a respective color. The individual color filters are formed to be adjacent one another in the completed color filter array.

The photoresist commonly used to form the color filters has limited resolution, and may suffer from shrinkage and poor planarity which may affect the optical properties of the color filter array as well as an overlying lens array. In addition, when the color filters are formed in close proximity or in contact with one another, stray light can travel between pixels resulting in optical crosstalk.

Accordingly, it is advantageous to provide an improved structure for the color filter array which more effectively and accurately defines the boundaries and colors of the various color filters to improve color separation and/or which blocks light from being transmitted between color filters to reduce optical crosstalk with a minimum of added complexity to the manufacturing process and/or increase in fabrication costs. It is also advantageous to provide a method of fabricating a color filter array exhibiting these improvements.

BRIEF DESCRIPTION OF THE DRAWINGS

The above-described features and advantages of the present invention will be more clearly understood from the following detailed description, which is provided with reference to the accompanying drawings, in which.

DETAILED DESCRIPTION OF THE INVENTION

Figure 1:
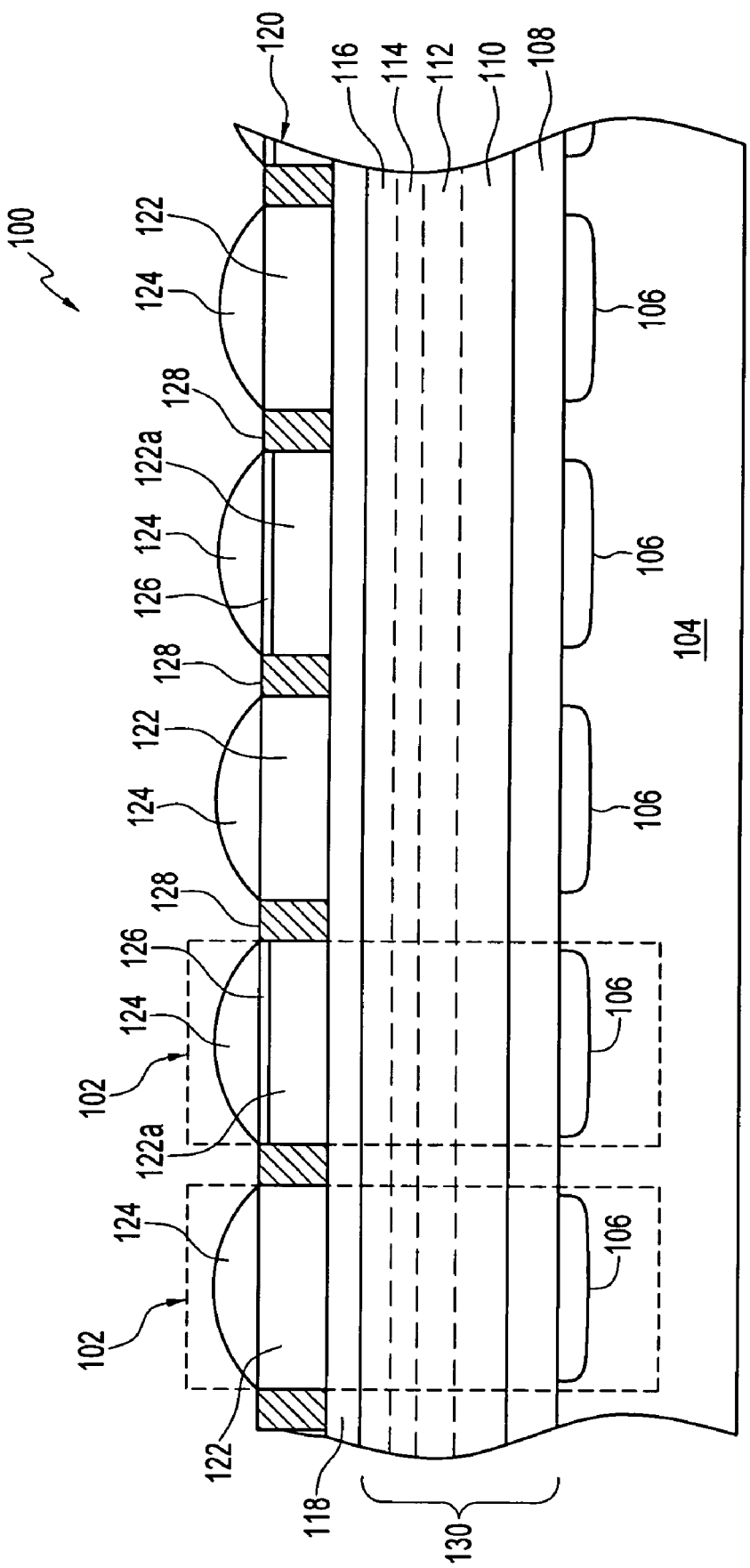
FIG. 1 illustrates a partial cross-sectional view of an imaging device containing a color filter array constructed in accordance with an exemplary embodiment of the invention.

In the following detailed description, reference is made to the accompanying drawings, which form a part hereof and show by way of illustration specific embodiments in which the present invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "substrate" used in the following description may include any supporting structure including, but not limited to, a semiconductor substrate that has a surface on which devices can be fabricated. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate in the following description, previous process steps may have been utilized to form regions or junctions in or over the base semiconductor or foundation.

The term "pixel" or "pixel cell" as used herein, refers to a photo-element unit cell containing a photosensor for converting photons to an electrical signal as may be employed by an imager device. Although the pixel cells are illustrated herein in the exemplary embodiments as CMOS four-transistor (or 4-T) pixel cells, this is not intended to be limiting in any way. For example, the pixel cells could have more or less than four transistors and the invention may be employed in other solid state imagers other than CMOS imagers where a different pixel architecture may be used.

Embodiments of the present invention provide an imaging device having an improved color filter array. According to one aspect of the present invention, the imaging device can have a color filter array formed using a patterned mask layer to define the boundaries of selected color filters in the color filter array and which maintains such boundaries during the process of making the color filter array. According to another aspect of the present invention, the imaging device can have a light blocking spacer formed to surround each of the various color filters to block light from being transmitted between adjacent color filters and to a peripheral circuitry region and/or to improve color separation. The imaging device is capable of more effectively and accurately defining the boundaries and colors of the various color filters to improve color separation and/or to reduce optical crosstalk. Additional embodiments of the present invention provide methods of fabricating an imaging device containing such a color filter array.

Various embodiments of the present invention will now be described with reference to the drawings, in which like reference numerals represent like elements and redundant description is omitted. Although the present invention is described in relation to use with a CMOS imager, as noted, the present invention is not so limited and has applicability to any solid state imager.

FIG. 1 illustrates a cross-sectional view of an imaging device 100 constructed in accordance with an exemplary embodiment of the invention. The imaging device 100 contains an array of pixel cells 102 formed over a substrate 104. Each pixel cell 102 includes a photosensitive region 106 formed in association with the substrate 104. A plurality of conventional layers, illustrated as interlayer dielectric layers 108, 110, 112, 114, and 116, with associated metallization patterns can be formed over the substrate 104. Those skilled in the art will appreciate that the substrate 104, the photosensitive regions 106, interlayer dielectric layers 108, 110, 112, 114, and 116, and associated metallization patterns can be formed by various methods, which are known in the art.

As illustrated in FIG. 1, a passivation layer 118 can be provided over the dielectric layers 108-116, on which a color filter array 120 can be formed as described below. The passivation layer 118 can be formed, for example, of a phospho-silicate-glass (PSG), silicon nitride, and oxynitride. Although only one passivation layer 118 is shown, more than one passivation layer can be formed.

The pixel cells 102 each also include a color filter 122 formed on the passivation layer 118 over the corresponding photosensitive region 106. The color filters 122 collectively form a color filter array 120, over which lies an array of microlenses 124. The color filter array 120 can have filters 122 for different wavelengths of light formed in various patterns, such as a Bayer filter pattern. It should be appreciated that various other color filter patterns may be used as well.

In one embodiment of the present invention, the color filter array 120 may further comprise a patterned mask layer 126 formed over at least selected color filters 122a. In an exemplary embodiment, the selected color filters 122a are green filters in a color filter array having a Bayer filter pattern. Those skilled in the art will appreciate that the patterned mask layer 126 may be formed in various other filter patterns.

The patterned mask layer 126 is formed to define and maintain the boundaries of the selected color filters 122a. For example, when used in association with green filters of a Bayer pattern, the patterned mask layer 126 helps to accurately defined the locations of the green filters which may be first formed, and also accurately defines the locations of red and blue filters which are each located between green filters in later formation operations.

According to one aspect of the invention, the patterned mask layer 126 can be provided with a predetermined pattern formed by any of various methods and be used as a mask to selectively remove the unwanted color filter material to form the selected color filters 122a. In a desired embodiment, the predetermined pattern is formed in the patterned mask layer 126 by using a photoresist material having a high resolution, such as of about 1 micrometer resolution. The predetermined pattern so formed is thus capable of more accurately defining the boundaries of the selected color filters 122a after the predetermined pattern is transferred to the selected color filters 122a. Those skilled in the art will appreciate that the patterned mask layer 126 can be formed in various other ways, which are also within the scope of the claimed invention.

According to another aspect of the invention, the patterned mask layer 126 is formed to be capable of maintaining the boundaries of the selected color filters 122a during the fabrication process, including various steps such as photolithography and selective etching. In one exemplary embodiment, the patterned mask layer 126 may remain on the selected color filters 122a and not be removed until all the color filters 122 are formed. For example, the patterned mask layer 126 can be removed from the color filter array 120 by a chemical mechanical polishing (CMP) step after all the color filters 122 are formed. In such a case, the finally formed color filter array 120 does not contain a patterned mask layer 126. In another exemplary embodiment, the patterned mask layer 126 can be an integrated part of the formed color filter array 120. For example, when the patterned mask layer 126 is formed of a transparent material, the transparent mask layer 126 can be left on the selected color filters 122a and does not need to be removed from the color filter array 120. The patterned mask layer 126 thus protects the upper surfaces and/or sidewalls of the selected color filters 122a during the fabrication process of the color filter array 120 and maintains the predetermined pattern of the selected color filters 122a.

The patterned mask layer 126 can be formed of various materials. In an exemplary embodiment, the mask layer materials can have a lower etch rate than that of the materials of the selected color filters 122a. For example, the mask layer materials can be selective to photoresist materials, such as those used for the selected color filters 122a, so that the patterned mask layer 126 can last until at least the selected color filters 122a are formed. In a desired embodiment, the patterned mask layer 126 may last until all the color filters 122 are formed in the color filter array 120.

Additionally or alternatively, the mask layer materials can be so determined that the formation of the patterned mask layer 126 will not adversely affect the selected color filters 122a. For example, the mask layer 126 may be formed with materials that are compatible with various photoresist materials used to form the selected color filters 122a. In an exemplary embodiment where the selected color filters 122a are formed at a temperature of about 240° C. before the patterned mask layer 126 is formed, suitable mask materials may be those that can be formed at a temperature of about 250° C. or less.

Exemplary materials for the patterned mask layer 126 may include, but are not limited to, oxide materials, silicon nitride materials (e.g., silicon oxynitride), and polysilicon materials. In a desired embodiment, the patterned mask layer 126 is formed of an oxide material. Those skilled in the art will appreciate that the patterned mask layer 26 can be formed of various other materials, which are also within the scope of the present invention.

The patterned mask layer 126 can have various thicknesses. In an exemplary embodiment, the thickness of the patterned mask layer 126 can be less than about 500 Angstroms. It is desired that the patterned mask layer 126 has its thickness formed in the range from about 200 Angstroms to about 500 Angstroms.

In another embodiment of the invention, the color filter array 120 may also comprise a light blocking spacer 128 to separate the adjacent filters 122 from each other and thereby reduce optical crosstalk between pixel elements underneath the color filter array 120. For example, the light blocking spacer 128 can be formed between and integrated with two adjacent filters 122 in the color filter array 120. Each light blocking spacer 128 can be formed of an opaque material that can effectively block incoming light from passing through the light blocking spacers 128. For example, the light blocking spacers 128 can operate to either absorb or reflect incoming light. Therefore, the light blocking spacers 128 form a light block separating adjacent filters 122 to reduce optical crosstalk in the photosensitive regions 106 and to more accurately define color filter boundaries and colors.

The light blocking spacers 128 can be made of various light blocking materials to block or reflect the intensity of incoming light, such as stray light. For example, the light blocking spacers 128 can comprise a metallic material, such as metal (e.g., aluminum), metal alloy, and metal silicides. In an exemplary embodiment, the light blocking spacers 128 are formed of aluminum. Additionally or alternatively, spacer materials can also be any other suitable non-metallic materials, such as silicon and polysilicon materials. In a desired embodiment, the light blocking spacers 128 are formed of amorphous silicon.

Additionally or alternatively, spacer materials may be dependent on the materials for the color filters 122 so that the formation of the light blocking spacers 128 will not adversely affect the color filters 122. For example, the light blocking spacers 128 are formed of materials compatible with various photoresist materials, such as those for the selected color filters 122a. In an exemplary embodiment where the selected color filters 122a are formed at a temperature of about 240° C. before the light blocking spacers 128 are formed, suitable spacer materials may be those that can be formed at a temperature of about 250° C. or less. Exemplary spacer materials include, but are not limited to aluminum, and amorphous silicon. Those skilled in the art will appreciate that other materials can be used to form the light blocking spacers 128, which are also within the scope of the present invention.

The light blocking spacers 128 can be formed with various lateral thicknesses without obstructing the photosensitive regions 106. For example, the light blocking spacers 128 in the color filter array 120 can have a lateral thickness of less than about 3000 Angstroms or in the range from about 500 Angstroms to about 3000 Angstroms. In an exemplary embodiment, the light blocking spacers 128 can have a lateral thickness of about 2000 Angstroms. The thickness of the light blocking spacer 128 can be dependent on factors such as the spacer material used. In an exemplary embodiment where the light blocking spacers 128 are made of aluminum, the spacer thickness can be about 500 Angstroms. In an exemplary embodiment, the light blocking spacers 128 are formed to have substantially the same lateral thickness around the sidewalls of the color filters 122 so that two adjacent color filters 122 are laterally evenly spaced from one another.

It is desired that the light blocking spacers 128 are formed to substantially cover the entire sidewalls of each color filter 122. For example, the light blocking spacers 128 are substantially level with the upper surfaces of the color filters 122. In one exemplary embodiment, the light blocking spacers 128 may extend between the upper surfaces of the color filters 122 and the passivation layer 118. In a desired embodiment, the light blocking spacers 128 extend between the upper surface of the patterned mask layer 126 and the passivation layer 118. Additionally or alternatively, the light blocking spacers 128 may surround the sidewalls of each color filter 122. The light blocking spacers 128 so form are capable of assisting in defining the boundaries of the color filters 122. Those skilled in the art will appreciate that various other materials and/or methods, in addition to those discussed above, can be used to form the light blocking spacers 128, which are also within the scope of the claimed invention.

Also, although FIG. 1 illustrates the use of light blocking spaces 128 with the patterned mask layer 126, the spaces 128 may also be used in a color filter array 120 which does not use the patterned mask layer 126 to define the location of filter 122a.

Figure 2A:
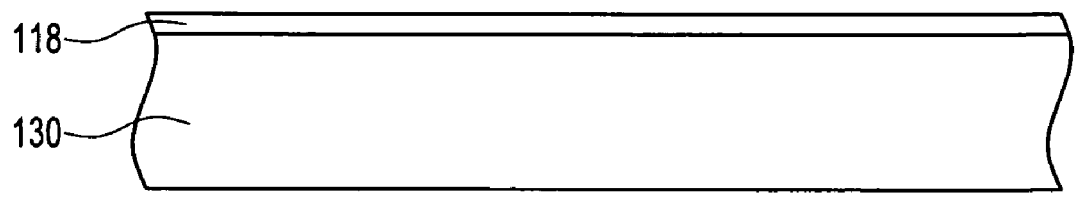
FIGS. 2A-2J illustrate an exemplary method of fabricating an imaging device containing the color filter array as shown in FIG. 1.

FIGS. 2A-2J illustrate an exemplary method of fabricating an imaging device 100 having the color filter array 120 (FIG. 2J) formed over a passivation layer 118. Similar to FIG. 1, the passivation layer 118 is formed over the various conventional layers, which are collectively referred to and illustrated as a fabricated structure 130, as shown in FIG. 2A. The array of photosensitive regions 106 and dielectric and interconnect metallization layers, which are included within the fabricated structure 130, are not shown in FIGS. 2A-2J for convenience purposes.

Figure 2B:
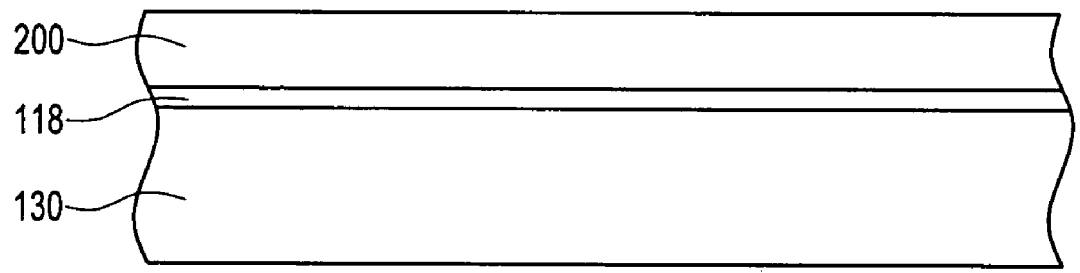

As is illustrated in FIG. 2B, a first color filter material layer 200 is formed over the passivation layer 118 by any of various methods. For example, the first color filter material layer 200 can be coated on the passivation layer 118, and then cured. In a desired embodiment, the first color filter material layer 200 is cured at a temperature of about 240° C. In another embodiment, the first color filter material layer 200 is deposited over the passivation layer 118 by spin-coating methods. The spin-coating technique provides a simplified fabrication process resulting in a substantially planar material layer with minimal fabricating costs. Those skilled in the art will appreciate that various other methods can be used to form the first color filter material layer 200.

The first color filter material layer 200 can be made of various transparent materials suitable for color filters. In an exemplary embodiment, the first color filter material layer 200 is formed of a material having a coloring suitable to form green filters. The materials forming the first color filter material layer 200 can be either positive or negative photoresist. In one exemplary embodiment, the material for the first filter material layer 200 is sensitive to i-line radiation. In an alternative exemplary embodiment, the first color filter material layer 200 may be formed of a non-photo sensitive material. Exemplary materials for the first color filter material layer 200 can include, but not be limited to, zinc selenide (ZnSe), silicon oxide, silicon nitride, silicon oxynitride, silicon-carbon (SiC) (BLOk), tantalum pentoxide ($Ta_2O_5$), titanium oxide ($TiO_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, or polyester acrylate.

Figure 2C:
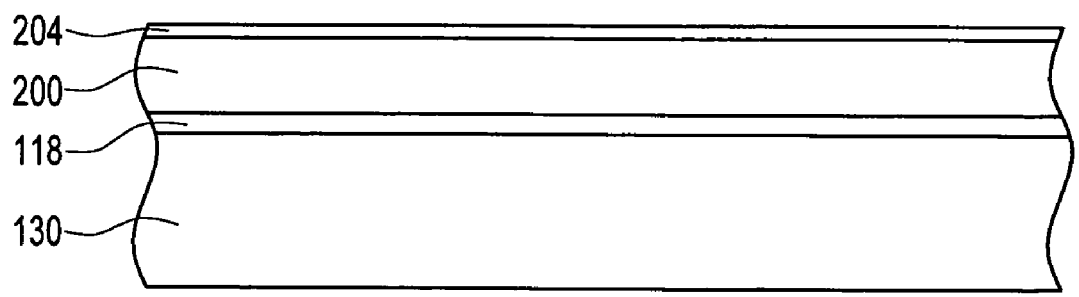

As is illustrated in FIG. 2C, a mask layer 204 is formed over the first color filter material layer 200 by any of various methods. For example, the mask layer 204 can be a continuous layer deposited on the first color filter material layer 200, such as by chemical vapor deposition (CVD). In one exemplary embodiment, the formation of the mask layer 204 is carried out at a temperature of under about 250° C. In another exemplary embodiment, the mask layer 204 is formed over the first color filter material layer 200 at room temperature. The thickness of the mask layer 204 can be less than about 500 Angstroms. For example, the mask layer 204 can have a thickness in the range from about 200 Angstroms to about 500 Angstroms.

The mask layer 204 can be formed with any of the materials described above in connection with the patterned mask layer 126. For example, the mask layer 204 can be made of an oxide material. Portions of the mask layer 204 can be selectively removed to form a predetermined pattern and then be used to form the first color filters 202 (FIGS. 2F-2J) as described below.

Figure 2D:
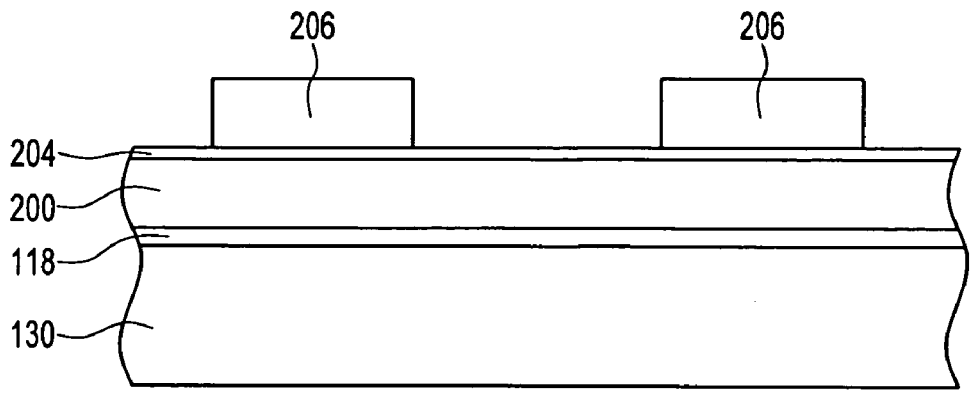

FIG. 2D shows a pattern layer 206 being formed over the mask layer 204 by one of any various methods. For example, the pattern layer 206 can be formed by patterning a photoresist material layer (not shown) formed on the mask layer 204, such as through a photolithographic exposure process. In an exemplary embodiment, the pattern layer 206 can be provided with a predetermined pattern and used as a mask to pattern the mask layer 204 as described below. For example, the predetermined pattern on the pattern layer 206 can be used to form the first color filters 202 (FIGS. 2F-2J). In an exemplary embodiment, when the first color filter material layer 200 is made of a positive photoresist, the pattern layer 206 can have the same pattern as the first color filters 202 in the color filter array 120. In a desired embodiment, the pattern layer 206 can have the same pattern of green filters in a Bayer filter pattern.

Various materials can be used to form the pattern layer 206. For example, the pattern layer 206 can be formed of any of the various photoresist materials to facilitate the patterning process through photolithographic exposure. In an exemplary embodiment, the pattern layer 206 is formed of a photoresist material that is sensitive to i-line radiation, primarily at 365 nanometers. It is desired that the pattern layer 206 is formed of an i-line photoresist material having a high resolution of about 1 micrometer resolution. The high resolution property of the pattern layer 206 can allow its predetermined pattern to be more accurately transferred onto the mask layer 204, which in turn can more accurately define the boundaries of the first color filters 202 (FIGS. 2F-2J) as described below.

Figure 2E:
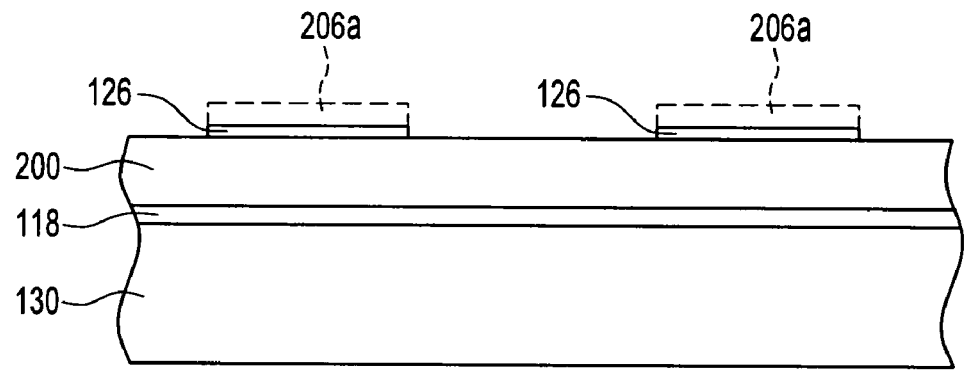

FIG. 2E illustrates that portions of the mask layer 204 (FIGS. 2C-2D) are selectively removed to form the patterned mask layer 126 by any of various methods. For example, a standard etching technique can be used. In one exemplary embodiment, the pattern layer 206 is used as a mask to form the patterned mask layer 126. As described above, the pattern layer 206 may be formed with a predetermined pattern, which conforms to the desired pattern of the first color filters 202 (FIGS. 2F-2J). Such predetermined pattern can be transferred into the mask layer 204 to form a patterned mask layer 126 by any of various methods, such as an etching process. In a desired embodiment where the pattern layer 206 is made of a photoresist material of a high resolution, such as of about 1 micrometer resolution, the predetermined pattern formed in the patterned mask layer 126 has an enhanced accuracy to facilitate the formation of better defined first color filters 202 (FIGS. 2F-2J).

Additionally or alternatively, the first pattern layer 206 is capable of removing all the materials at the unwanted portions on the mask layer 204 having a predetermined thickness. In an exemplary embodiment, the first pattern layer 206 may be completely consumed during the etching process and removed along with the unwanted portions of the mask layer 204, so that no part of the first pattern layer 206 is left after the patterned mask layer 126 is formed. In another exemplary embodiment, a portion 206a of the first pattern layer 206 may be left on the resultant patterned mask layer 126, such as shown by the dotted lines in FIG. 2E. The remaining portion 206a, as well as the patterned mask layer 126, can be used as a mask to selectively remove portions of the first color filter material layer 200 and form the first color filters 202 as described below.

Figure 2F:
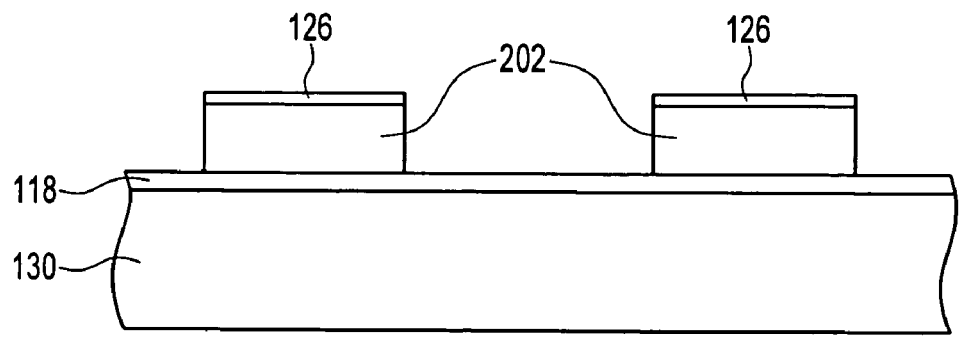

FIG. 2F illustrates that the first color filters 202 are formed by any of various methods, such as a standard etching technique. For example, the unwanted portions on the first color filter material layer 200 can be removed using selective photoresist stripping techniques, such as a wet or dry etch. In an exemplary embodiment, the remaining portion 206a of the first pattern layer 206 can be used as a mask to form first color filters 202. In a desired embodiment, the remaining portion 206a of the first pattern layer 206 (FIG. 2E) is completely removed together with the unwanted portions on the first color filter material layer 200 when the first color filters 202 are formed.

Additionally or alternatively, the patterned mask layer 126 is used as an etch mask to transfer the predetermined pattern to the first color filter material layer 200. For example, the patterned mask layer 126 may be formed of a material having a lower etch rate, in presence of a predetermined etchant, than that of the first color filter material layer 200. The patterned mask layer 126 can thus last throughout the etching process until or after the unwanted portions on the first color filter material layer 200 are removed. The remaining portions on the first color filter material layer 200 form the first color filters 202. As noted, the first color filters 202 can be formed as green filters laid out in accordance with a Bayer filter pattern. Those skilled in the art will appreciate that the above process steps can be similarly used to first form red or blue filters laid out in various filter patterns.

Figure 2G:
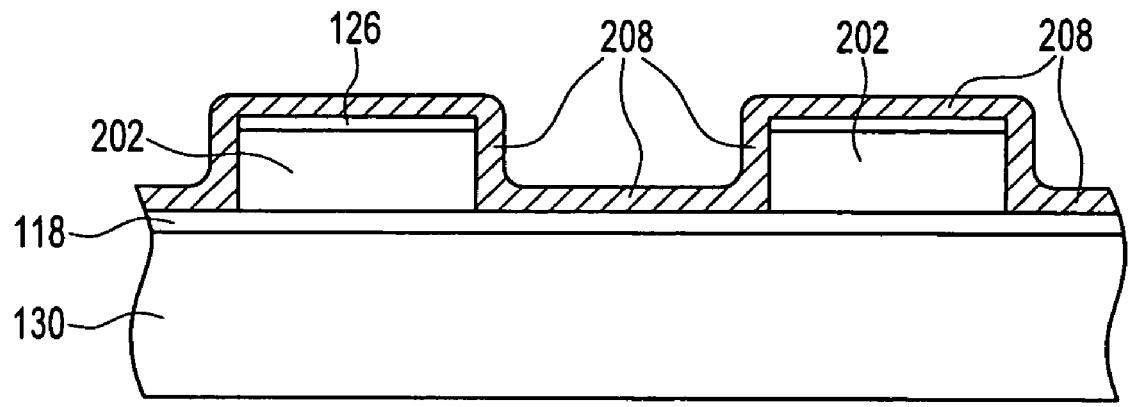

FIG. 2G shows that a spacer layer 208 is formed over the patterned mask layer 126 by any of various methods. For example, the spacer layer 208 can be deposited over the patterned mask layer 126 and cover the sidewalls of the first color filters 202. The spacer layer 208 can be formed by any suitable conformal technique, including one or more spin-on techniques or any other technique for conformal material deposition, such as CVD or physical vapor deposition (PVD). In one exemplary embodiment, a plasma enhanced chemical vapor deposition (PECVD) process can be used to form an aluminum spacer layer 208. It is desired that the spacer layer 208 is formed at a temperature of about 250° C. or less.

The spacer layer 208 can be formed to have various thicknesses. For example, the spacer layer 208 can have a thickness in the range from about 1000 Angstroms to about 4000 Angstroms when the spacer layer 208 is initially formed over the patterned mask layer 126. In an exemplary embodiment, an aluminum spacer layer 208 can be formed to have a thickness of about 1000 Angstroms. Those skilled in the art will appreciate that such initial thickness of the spacer layer 208 is subjected to reduction during a spacer removal process as described below. Additionally or alternatively, various materials can be used to form the spacer layer 208, such as those discussed above in connection with the light blocking spacers 128. In one exemplary embodiment, the spacer layer 208 is made of an amorphous silicon material.

Figure 2H:
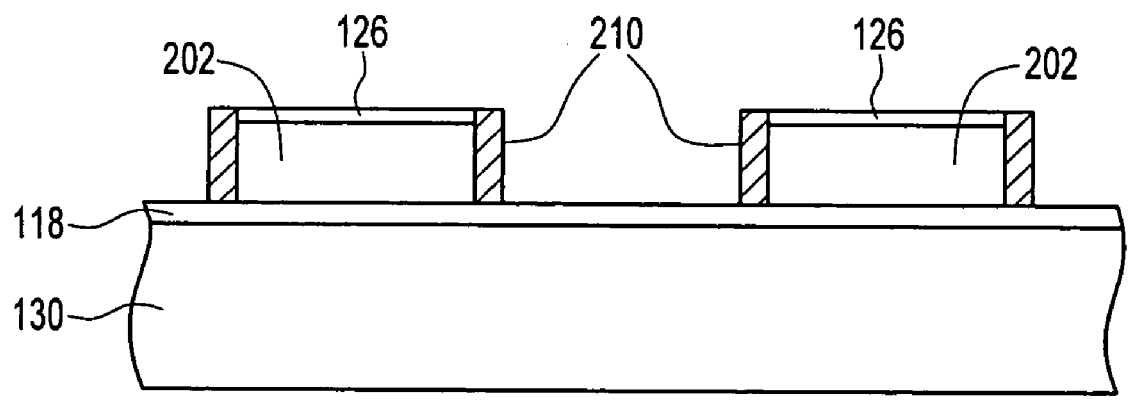

FIG. 2H illustrates that one or more light blocking spacers 210 are formed by any of various spacer material removal methods. For example, an unmasked process can be used to etch the spacer layer 208. In another exemplary embodiment, the spacer layer 208 can be etched using a patterned filter layer (not shown). The unmasked or patterned photoresist process leaves the light blocking spacers 210 integrated with the sidewalls of the first color filters 202. It will be appreciated that the spacer removal process may reduce the lateral thickness of the spacer layer 208 on the sidewalls of the first color filters 202. The resultant light blocking spacers 210 can thus have a smaller lateral thickness than that of the spacer layer 208. For example, the light blocking spacers 210 can have a thickness ranging from about 500 Angstroms to about 3000 Angstroms. In an exemplary embodiment where the light blocking spacer 210 is formed of aluminum, the final spacer thickness can be about 500 Angstroms.

In a desired embodiment, the patterned mask layer 126 can be used to maintain the shapes and boundaries of the first color filters 202 during the spacer formation process. In an exemplary embodiment, the patterned mask layer 126 can be used as a stopping layer when removing the portions of the spacer layer 208 formed over the first color filters 202. For example, when the unwanted portions of the spacer layer 208 are removed by an etching process, the patterned mask layer 126 can keep the etchant from contacting the first color filters 202. The patterned mask layer 126 can thus protect the first color filters 202 after they are initially formed to maintain the pattern integrity.

Figure 2I:
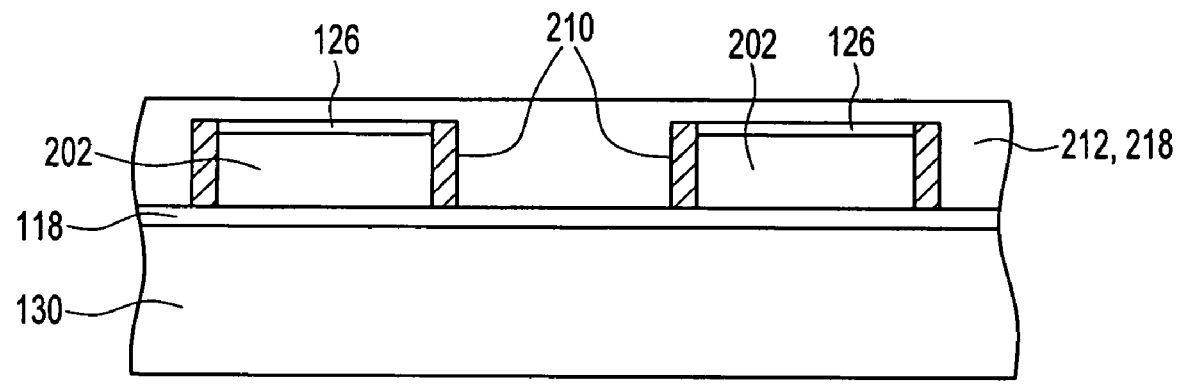

FIG. 2I illustrates a second color filter material layer 212 being formed over the patterned mask layer 126 by any of various conventional methods. For example, the second color filter material layer 212 is deposited over the first color filters 202, the light blocking spacers 210, and the passivation layer 118 between light blocking spacers 210, such as by coating. In an exemplary embodiment, a blue filter material layer 212 is formed.

The second color filter material layer 212 can be formed of any of suitable materials, such as positive or negative photoresist. For example, the second color filter material layer 212 is formed of a material sensitive to i-line radiation. Additionally or alternatively, the second color filter material layer 212 is formed of a material having a high resolution of about 1 micrometer resolution. Exemplary materials for the second color filter material layer 212 can include, but not be limited to, zinc selenide (ZnSe), silicon oxide, silicon nitride, silicon oxynitride, silicon-carbon (SiC) (BLOk), tantalum pentoxide ($Ta_2O_5$), titanium oxide ($TiO_2$), polymethylmethacrylate, polycarbonate, polyolefin, cellulose acetate butyrate, polystyrene, polyimide, epoxy resin, photosensitive gelatin, acrylate, methacrylate, urethane acrylate, epoxy acrylate, or polyester acrylate.

Figure 2J:
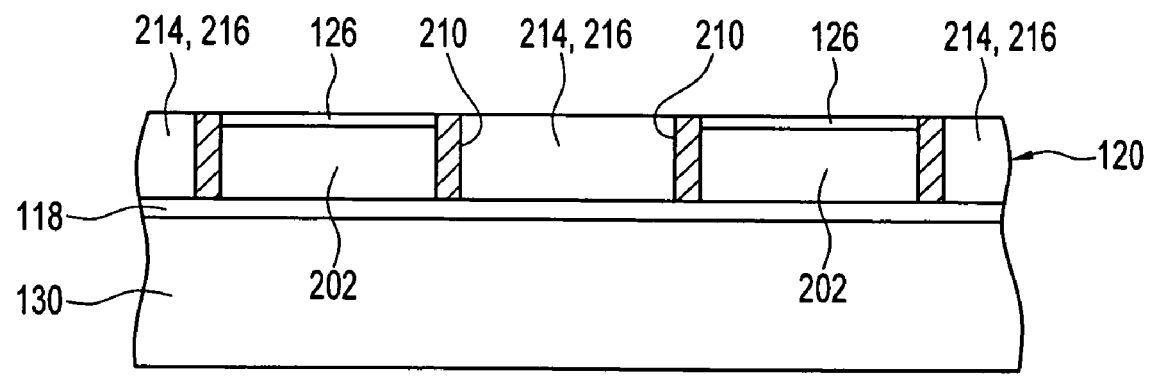

Various conventional methods can be used to remove unwanted portions on the second color filter material layer 212, thus producing second color filters 214, such as those shown in FIG. 2J. In one exemplary embodiment, standard lithography can be used to pattern the second color filter material layer 212 made of various photoresist materials. The light source used can have any wavelength providing the required lithographic resolution. For example, a light source (not shown), such as an i-line light source (e.g., 365 nanometers), shines on a photomask (not shown) and exposes a portion of the second color filter material layer 212, which is sensitive to i-line radiations. The unwanted portions on the second color filter material layer 212 can then be removed by any of various conventional methods, such as a developing process.

In an exemplary embodiment, the patterned mask layer 126 continues to maintain the shapes and boundaries of the first color filters 202 after they are initially formed. For example, the patterned mask layer 126 can be used as a stopping layer to protect the first color filters 202 during a planarization process, such as a CMP process, to remove portions of the second color filter material layer 212 deposited over the patterned mask layer 126. Additionally or alternatively, the patterned mask layer 126 can prevent color pigments in the second color filter material layer 212 from mixing into the first color filters 202 and thereby improve color separation. The patterned mask layer 126 can thus maintain the pattern integrity of the first color filters 202 after they are initially formed.

The second color filters 214 are thus formed with light blocking spacers 210 separating the first and second color filters 202, 214 from each other. It should be noted that since the first color filters 202 were spatially located with high precision using patterned mask layer 126, the second color filter 214, located between the first color filters 202, will also be located with high precision.

The steps described in connection with FIGS. 2I-2J can be repeated to form third color filters 216, such as red filters. For example, a third filter material layer 218 can be formed by coating. The third filter material layer 218 can be formed of any of suitable materials, such as those used for making the second color filter material layer 212. In an exemplary embodiment, a planarizing step is carried out to remove unwanted portions of the third filter material layer 218, such as those deposited over the first and second color filters 202 and 214 and the light blocking spacers 210, to form the third color filters 216. In a desired embodiment, the patterned mask layer 126 is used as stopping layer in the planarizing step. As discussed above, the patterned mask layer 126 thus continues to maintain the shapes and boundaries of the first color filters 202 to improve color separation.

After forming all the color filters 202, 214, and 216 (e.g., green, blue, and red filters), a final planarizing step, such as a CMP step, can be conducted to remove any unexposed color pigment and form the color filter array 120. In a desired embodiment, the patterned mask layer 126 can function as an etch-stop during the planarizing step. As discussed above, the patterned mask layer 126 can thus continue to maintain the shapes and boundaries of the first color filters 202 to thereby improve color separation. In one exemplary embodiment, the patterned mask layer 126 can be removed during the final planarizing step.

FIG. 2J shows one row of a color filter array 120, where the first color filters 202 alternate with one of the second and third color filters 214 and 216. The light blocking spacers 210 are formed around the sidewalls of color filters 202, 214, and 216 and between adjacent color filters to thus function as light blocks between adjacent color filters and reduce optical crosstalk between pixels. Additionally or alternatively, the light blocking spacers 210 are formed following the accurate pattern of the first color filters 202 produced with the patterned mask layer 126. Therefore, the light blocking spacers 210 can contribute to more accurately define and maintain the regions and boundaries for the first color filters 202, as well as those for the second and third color filters 214, and 216.

Figure 3:
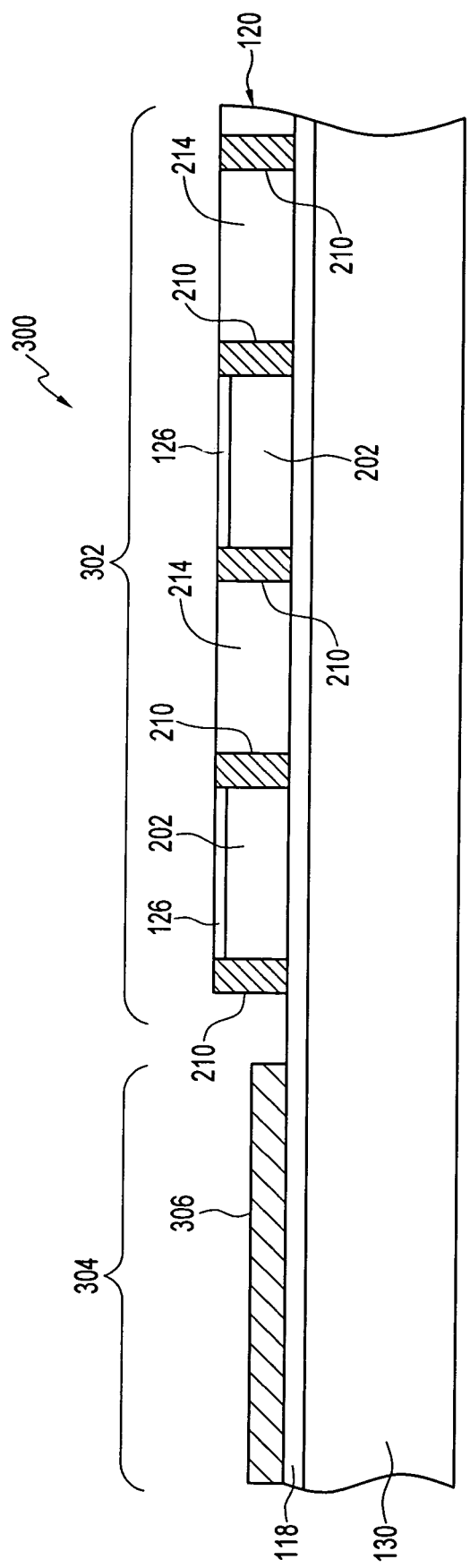
FIG. 3 is a partial cross-sectional view of an imaging device formed in accordance with another exemplary embodiment of the present invention.

FIG. 3 is a partial cross-sectional view of an imaging device 300 formed according to another exemplary embodiment of the present invention. The imaging device 300 has a pixel region 302 similar to those shown in FIGS. 2A-2J. In addition, FIG. 3 shows a periphery region 304 of the imaging device 300 where peripheral circuitry can be formed. In the FIG. 3 embodiment, both the pixel region 302 and the periphery region 304 can be formed with light blocking spacers 210 and 306, respectively. For example, in addition to the light blocking spacers 210 described above, the second light blocking spacer 306 can be formed over the passivation layer 118 at a location over the periphery region 304 and outside the pixel region 302. The second light blocking spacer 306 can substantially block all light from reaching the periphery region 304, thus reducing the effect of light on transistors or other circuitry in the periphery region 304.

The second light blocking spacer 306 can be formed of the same materials as described above with reference to the light blocking spacers 210 and is capable of substantially absorbing or reflecting incoming light. In an exemplary embodiment, the second light blocking spacer 306 can be formed with an amorphous silicon material. In an exemplary embodiment, the second light blocking spacer 306 can have a thickness of about 500 Angstroms to about 3000 Angstroms.

Figure 4A:
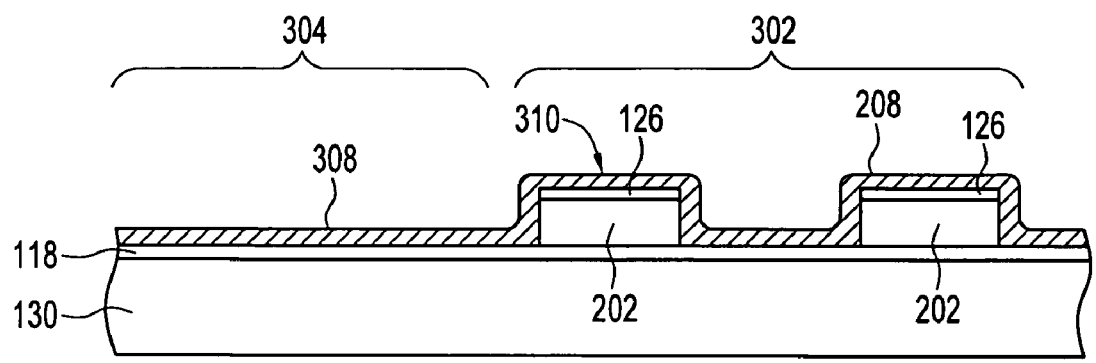
FIGS. 4A-4C illustrate another exemplary method of fabricating an imaging device containing the color filter array as shown in FIG. 3.
Figure 4B:
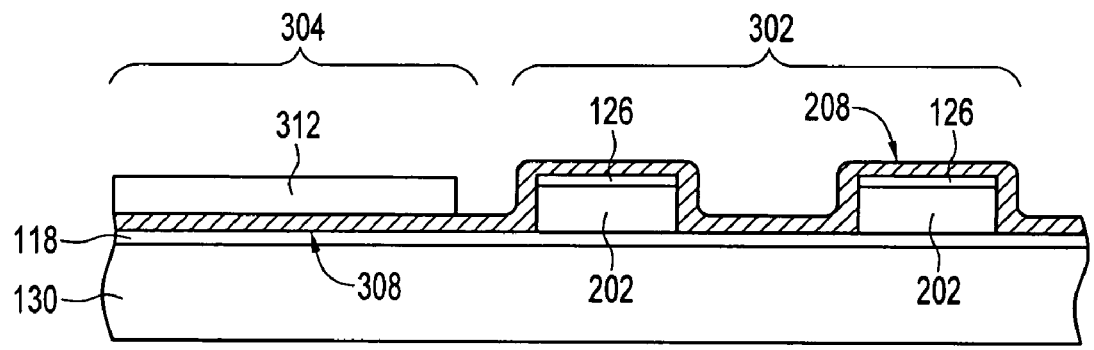
Figure 4C:
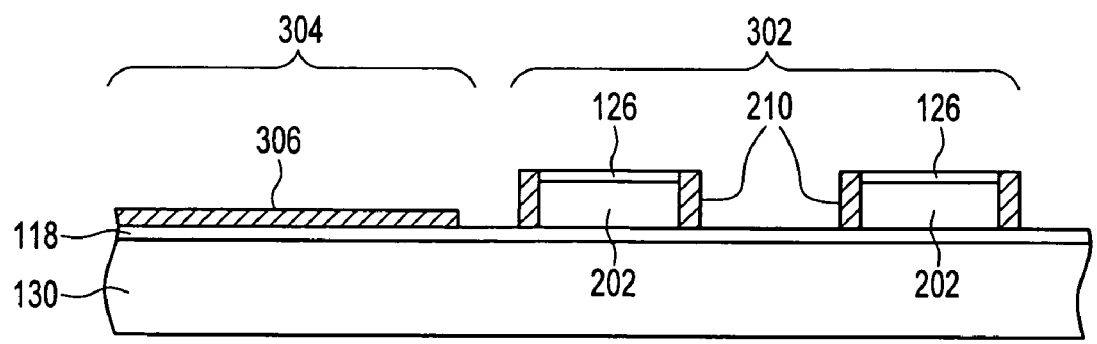

The formation of an imaging device 300 containing a second light blocking spacer 306 is now described with reference to FIGS. 4A-4C. Similar to FIG. 1, the passivation layer 118 is provided and formed over an array of photosensitive regions, peripheral circuitry, and dielectric and interconnect metallization layers, which are shown in FIGS. 4A-4C collectively as 130 for convenience purposes. The steps described herein need not be performed in any particular order, except for those logically requiring the results of prior actions. Accordingly, while the steps below are described as being performed in a general order, the order is exemplary only and can be altered if desired.

Referring to FIG. 4A, a second spacer layer 308 can be formed on the substrate 118 in the periphery region 304 when the first spacer layer 208 is formed in the pixel region 302 as discussed above in connection with FIG. 2G. Similar to the first spacer layer 208, the second spacer layer 308 can have a thickness of about 1000 Angstroms to about 4000 Angstroms. In a desired embodiment, the first and second spacer layers 208 and 308 can be formed as a single spacer layer 310, as shown in FIG. 4A.

The second spacer layer 308 is selectively removed by various methods, such as an etching technique. In an exemplary embodiment, the periphery region 304 is covered with a photoresist layer 312, as shown in FIG. 4B. The uncovered portion of the second spacer layer 308 can be etched, at the same time a spacer technique is performed on the spacer layer 208 as described above in connection with FIG. 2H. The second light blocking spacer 306 can be formed along with the light blocking spacers 210, as illustrated in FIG. 4C.

After the color filter array 120 is formed as described above and the upper surface of the color filters is planarized, conventional techniques can be used to form microlenses 124 over the color filters, as shown in FIG. 1.

Figure 5:
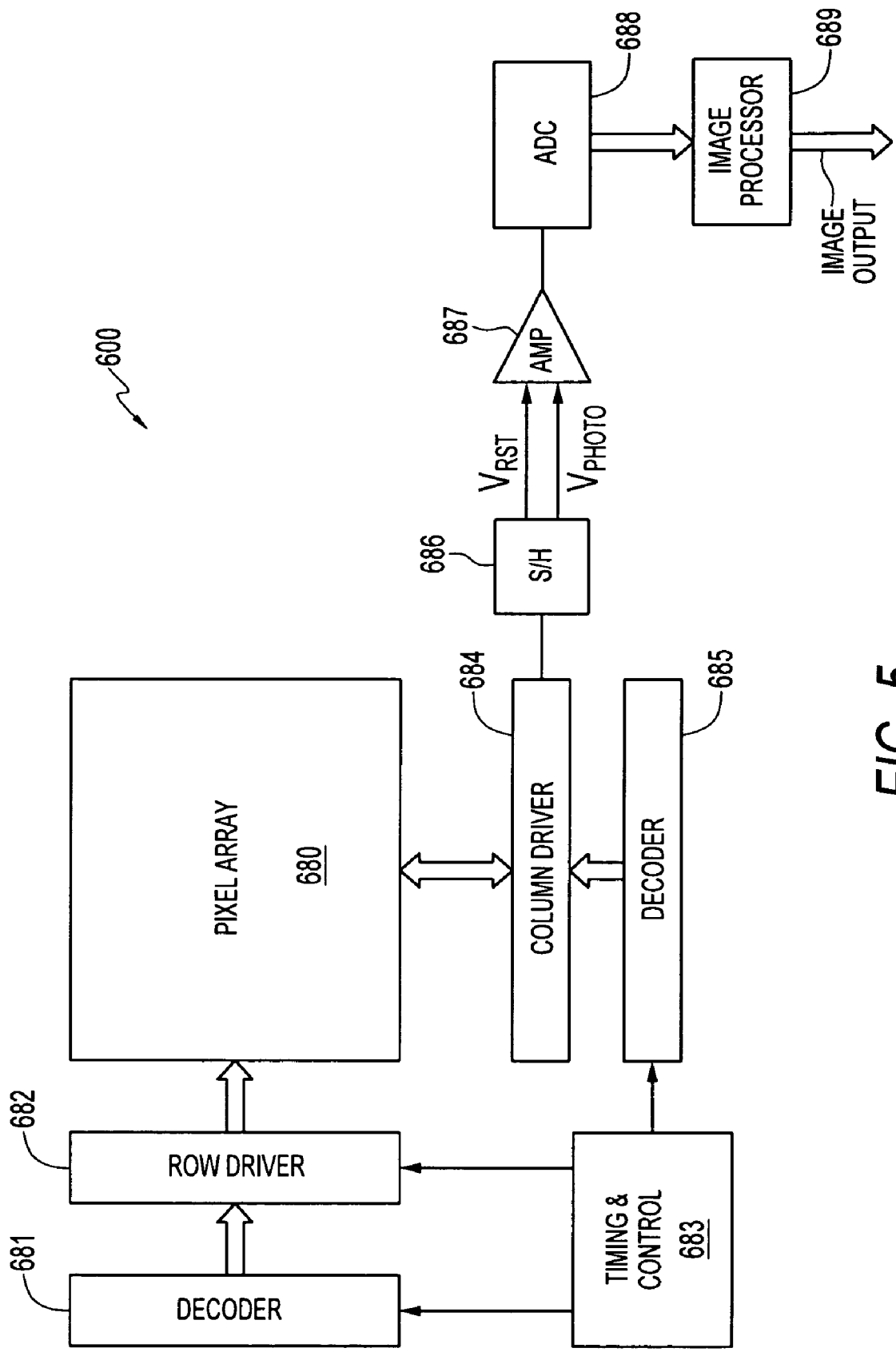
FIG. 5 is a block diagram of a CMOS imaging device incorporating a color filter array formed in accordance with various exemplary embodiments of the present invention.

FIG. 5 shows a block diagram of a typical single chip CMOS imaging device 600, which may use the color filter array formed in accordance with the present invention. The imaging device 600 includes a pixel array 680 having pixels and a color filter array constructed as described above. The pixels of array 680 are arranged in a predetermined number of columns and rows.

The rows of pixels in array 680 are read out one by one. Accordingly, pixels in a row of array 680 are all selected for readout at the same time by a row select line, and each pixel in a selected row provides a signal representative of received light to a readout line for its column. In the pixel array 680, each column also has a select line, and the pixels of each column are selectively read out onto output lines in response to the column select lines.

The row lines in the pixel array 680 are selectively activated by a row driver 682 in response to row address decoder 681. The column select lines are selectively activated by a column driver 684 in response to column address decoder 685. The pixel array 680 is operated by the timing and control circuit 683, which controls address decoders 681, 685 for selecting the appropriate row and column lines for pixel signal readout.

The signals on the column output lines typically include a pixel reset signal ($V_{rst}$) and a pixel image signal ($V_{photo}$) for each pixel. Both signals are read into a sample and hold circuit (S/H) 686. A differential signal ($V_{rst}-V_{photo}$) is produced by differential amplifier (AMP) 687 for each pixel, and each pixel's differential signal is digitized by analog-to-digital converter (ADC) 688. The analog-to-digital converter 688 supplies the digitized pixel signals to an image processor 689, which performs appropriate image processing before providing digital signals defining an image output.

Figure 6:
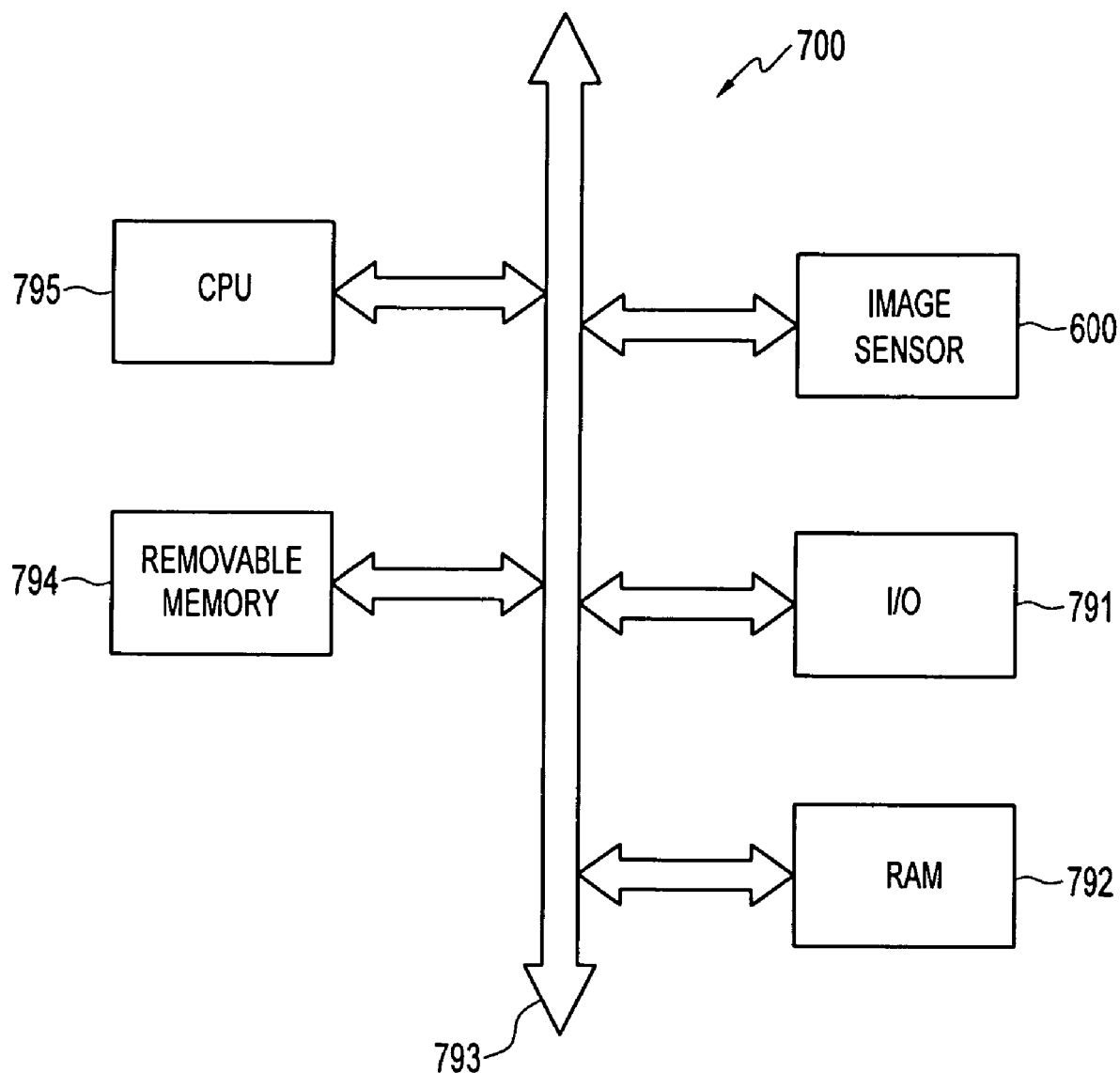
FIG. 6 is a schematic diagram of a processor system incorporating the imaging device formed in accordance with various exemplary embodiments of the present invention.

FIG. 6 illustrates a processor system 700 including the imaging device 600 of FIG. 5. The processor system 700 is exemplary of a system having digital circuits that could include imaging devices. Without being limiting, such a system could include a computer system, camera system, scanner, machine vision, vehicle navigation, video phone, surveillance system, auto focus system, star tracker system, motion detection system, and other systems supporting image acquisition.

The processor system 700, for example a camera system, generally comprises a central processing unit (CPU) 795, such as a microprocessor, that communicates with an input/output (I/O) device 791 over a bus 793. Imaging device 600 also communicates with the CPU 795 over bus 793. The processor system 700 also includes random access memory (RAM) 792, and can include removable memory 794, such as flash memory, which also communicate with CPU 795 over the bus 793. Imaging device 600 may be combined with a processor, such as a CPU, digital signal processor, or microprocessor, with or without memory storage on a single integrated circuit or on a different chip than the processor.

It is again noted that although described is the exemplary embodiment described with reference to a CMOS imager, the invention is not limited to CMOS imagers and can be used with other imager technology (e.g., CCD technology) as well.

It will be appreciated that the various features described herein may be used singly or in any combination thereof. Therefore, the present invention is not limited to only the embodiments specifically described herein. While the foregoing description and drawings represent exemplary embodiments of the present invention, it will be understood that various additions, modifications, and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. One skilled in the art will appreciate that the invention may be used with many modifications of structure, arrangement, proportions, materials, and components and otherwise, used in the practice of the invention, which are particularly adapted to specific environments and operative requirements without departing from the principles of the present invention. The presently disclosed embodiments are therefore to be considered in all

What is claimed as new and desired to be protected by Letters Patent of the United States is:

1. A method of forming a color filter array, the method comprising:
   forming a first color filter material layer over an underlying layer;
   forming a patterned mask layer only over said first color filter material layer, said patterned mask layer being formed as a permanent part of the color filter array;
   forming first color filters using said patterned mask layer to define boundaries of the first color filters; and
   forming additional color filters in the color filter array and over said underlying layer;
   wherein said patterned mask layer maintains said boundaries of the first color filters when forming said additional color filters in the color filter array.

2. The method of claim 1, wherein the step of forming a patterned mask layer comprises:
   forming a continuous mask layer over said first color filter material layer;
   forming a pattern layer over the mask layer, said pattern layer comprising a predetermined pattern conforming to that of the first color filters; and
   selectively removing portions of the continuous mask layer using the pattern layer as a mask.

3. The method of claim 2, wherein the step of forming a continuous mask layer is carried out at a temperature of about 250° C. or less.

4. The method of claim 2, wherein the pattern layer is completely removed when the patterned mask layer is formed.

5. The method of claim 2, wherein the pattern layer is formed of a photoresist material having a high resolution of about 1 micrometer resolution.

6. The method of claim 2, wherein the pattern layer is formed of a photoresist material sensitive to i-line radiation.

7. The method of claim 2, wherein said predetermined pattern corresponds to locations of green filters in a Bayer filter pattern.

8. The method of claim 7, wherein said additional color filters are at least one of red and blue filters in a Bayer filter pattern.

9. The method of claim 1, wherein the patterned mask layer is formed of a material having a lower etch rate in presence of a predetermined etchant than that of a material forming the first color filter material layer.

10. The method of claim 1, wherein the patterned mask layer has a thickness ranging from about 200 Angstroms to about 500 Angstroms.

11. The method of claim 1 further comprising:
    forming a spacer layer over said patterned mask layer; and
    selectively removing portions of said spacer layer to form a light blocking spacer integrated on sidewalls of said first color filters.

12. The method of claim 11, wherein the step of selectively removing said spacer layer comprises the step of using the patterned mask layer as a stopping layer.

13. The method of claim 1, wherein the step of forming additional color filters comprises:
    forming an additional filter material layer over the patterned mask layer; and
    selectively removing portions of the additional filter material layer to form additional color filters.

14. The method of claim 13, wherein the step of selectively removing said additional filter material layer comprises the step of using the patterned mask layer as a stopping layer.

15. The method of claim 14 further comprising:
    forming a spacer layer over the patterned mask layer; and
    selectively removing portions of the spacer layer to form a light blocking spacer integrated with and between two adjacent color filters in the color filter array.

16. The method of claim 1 further comprising removing the patterned mask layer after forming said additional color filters in the color filter array.

17. A method of forming an imaging device comprising a color filter array, the method comprising:
    providing a semiconductor structure comprising a pixel region;
    forming a first color filter material layer over the pixel region;
    forming a patterned mask layer over only the first color filter material layer;
    forming first color filters using the patterned mask layer as a mask;
    forming a second color filter material layer over the patterned mask layer; and
    selectively removing portions of the second color filter material layer to form additional color filters in the color filter array,
    wherein the patterned mask layer is an integrated part of the color filter array.

18. The method of claim 17 further comprising:
    forming a spacer layer over the patterned mask layer; and
    selectively removing portions of the spacer layer to form one or more light blocking spacers between and integrated with two adjacent color filters.

19. A method of forming a color filter array having red, green, and blue filters arranged in a Bayer filter pattern, the method comprising:
    forming a green filter material layer over an underlying layer;
    forming a patterned mask layer over said green filter material layer;
    forming the green filters using said patterned mask layer to define boundaries of the green filters; and
    forming at least one of red and blue filters over said underlying layer while said patterned mask layer is retained in place;
    wherein said patterned mask layer maintains said boundaries of the green filters when forming said at least one of red and blue filters in the color filter array, and is an integrated part of the color filter array.

20. The method of claim 19 further comprising:
    forming a spacer material layer over the green filters; and
    selectively removing the spacer material layer to form a light blocking spacer between two adjacent color filters.

21. A color filter array comprising:
    a plurality of color filters formed over an underlying layer; and
    a patterned mask layer formed over less than all of the color filters in the plurality of color filters.

22. The color filter array of claim 21, wherein the patterned mask layer has a lower etch rate in presence of a predetermined etchant than that of the material forming the less than all of the color filters.

23. The color filter array of claim 21, wherein the patterned mask layer is formed of a material selected from the group consisting of oxide, silicon nitride, and polysilicon materials.

24. The color filter array of claim 21, wherein the patterned mask layer has a thickness ranging from about 200 Angstroms to about 500 Angstroms.

25. The color filter array of claim 21 further comprising a light blocking spacer formed between and integrated with two adjacent color filters, wherein said light blocking spacer is formed of amorphous silicon.

26. The color filter array of claim 21 further comprising a plurality of light blocking spacers each integrated with two adjacent color filters, wherein said light blocking spacers and the patterned mask layer substantially cover said selected color filters.

27. An imaging device, comprising:
a semiconductor structure; and
a color filter array formed over an underlying layer supported on the semiconductor structure, said color filter array comprising first color filters, second color filters and a patterned mask layer formed over only said first color filters.

28. The imaging device of claim 27, wherein the patterned mask layer has a lower etch rate in presence of a predetermined etchant than that of the material forming the color filters.

29. The imaging device of claim 27, wherein the patterned mask layer is formed of a material selected from the group consisting of oxide, silicon nitride, and polysilicon materials.

30. The imaging device of claim 27, wherein the patterned mask layer has a thickness in the range of from about 200 Angstroms to about 500 Angstroms.

31. The imaging device of claim 27 further comprising one or more light blocking spacers formed between adjacent color filters, wherein the light blocking spacers are formed of amorphous silicon.

32. The imaging device of claim 27, wherein said imaging device is coupled to a processor of a processing system.

33. A color filter array comprising:
a plurality of color filters formed over an underlying layer; and
a resistant layer formed over less than all of the color filters in the plurality of color filters;
wherein the resistant layer comprises a material more resistant to removal than a material used in the color filters.

34. The color filter array of claim 33, wherein the resistant layer is formed of a material selected from the group consisting of oxide, silicon nitride, and polysilicon materials.

35. The color filter array of claim 33, wherein the resistant layer has a lower etch rate in presence of a predetermined etchant than that of the material forming the color filters.

36. The color filter array of claim 33, wherein the resistant layer is more resistant to a planarization process than is the material forming the color filters.

37. The color filter array of claim 33, where the resistant layer covers upper surfaces of the less than all of the color filters.

38. The color filter array of claim 33 further comprising a planarized surface constituted by the resistant layer and remaining color filters.

39. The color filter array of claim 33 further comprising one or more light blocking spacers each positioned between two adjacent color filters.

40. The color filter array of claim 39 further comprising a planarized surface formed by the resistant layer, the light blocking spacers, and remaining color filters.

41. An imaging device, comprising:
a semiconductor structure;
a color filter array formed over an underlying layer supported on the semiconductor structure, said color filter array comprising first color filters for filtering a first color, second color filters for filtering at least a second color and third color filters for filtering a third color; and
a discontinuous layer formed on the first color filters and not on the second or third color filters.

42. The imaging device of claim 41, wherein the discontinuous layer is formed of a material selected from the group consisting of oxide, silicon nitride, and polysilicon materials.

43. The imaging device of claim 41, wherein the discontinuous layer covers upper surfaces of the first color filters.

44. The imaging device of claim 41, further comprising a planarized surface formed on the discontinuous layer and the second color filters.

* * * * *